(12) United States Patent
Podlesny et al.

(10) Patent No.: US 6,366,130 B1
(45) Date of Patent: Apr. 2, 2002

(54) HIGH SPEED LOW POWER DATA TRANSFER SCHEME

(75) Inventors: Andrew V. Podlesny; Alexander V. Malshin; Alexander Y. Solomatnikov, all of Moscow (RU)

(73) Assignee: Elbrus International Limited, George Town Grand Cayman (KY)

( * ) Notice: Subject to any disclaimer, the term of this patent is extended or adjusted under 35 U.S.C. 154(b) by 0 days.

(21) Appl. No.: 09/505,656

(22) Filed: Feb. 17, 2000

Related U.S. Application Data

(60) Provisional application No. 60/120,531, filed on Feb. 17, 1999.

(51) Int. Cl.[7] ........................ H03K 19/0185; G11C 7/06
(52) U.S. Cl. .......................... 326/95; 326/86; 326/87; 326/90; 327/57; 327/55; 327/52
(58) Field of Search .................. 326/21–23, 26–28, 326/30, 86, 87, 90, 93, 95, 98; 327/51–57

(56) References Cited

U.S. PATENT DOCUMENTS

| | | | | | |
|---|---|---|---|---|---|
| 5,598,371 | A | * | 1/1997 | Lee et al. .............. | 365/189.05 |
| 5,781,028 | A | * | 7/1998 | Decuir .................... | 326/30 |
| 5,894,233 | A | * | 4/1999 | Yoon ...................... | 327/55 |
| 6,028,455 | A | * | 2/2000 | Yamauchi ............... | 327/52 |
| 6,147,514 | A | * | 11/2000 | Shiratake ............... | 327/55 |
| 6,154,064 | A | * | 11/2000 | Proebsting ............. | 327/55 |
| 6,184,722 | B1 | * | 2/2001 | Hayakawa .............. | 327/55 |

OTHER PUBLICATIONS

Article "On the Parallel Evaluation of Polynomials" in IEEE Transactions On Computer, vol. C–22, No. 1, Jan. 1973 by Kiyoshi Maruyama.

* cited by examiner

*Primary Examiner*—Michael Tokar
*Assistant Examiner*—Vibol Tan
(74) *Attorney, Agent, or Firm*—Townsend and Townsend and Crew LLP

(57) ABSTRACT

A data transfer arrangement. The data transfer arrangement includes two active pull up/active pull down bus drivers and a voltage precharge source. A differential bus is coupled to the bus drivers and to the voltage precharge source. A latching sense amplifier is coupled to the differential bus and serves as the bus receiver. The bus drivers operate in a precharge phase and a data transfer phase. The bus receiver operates in an analogous but opposite manner, i.e., when the bus drivers are in the precharge phase, the bus receiver is in the data transfer phase and when the bus drivers are in the data transfer phase, the bus receiver is in a precharge phase.

8 Claims, 2 Drawing Sheets

HIGH SPEED LOW POWER DATA TRANSFER SCHEME

This application claims priority from U.S. Provisional Patent Application No. 60/120,531, filed Feb. 17, 1999, the disclosure of which is incorporated herein by reference in its entirety.

BACKGROUND OF THE INVENTION

1. Field of the Invention

The present invention relates to a data transfer scheme, and more particularly, to a high speed and low power CMOS data transfer scheme.

2. Description of the Prior Art

Today's requirements for electronic circuits require high speed. Additionally, the circuits should be as small and simple as possible due to the ever increasing number of circuits that arc crowding today's chip devices. Furthermore, circuits for data transfer should not be sensitive to circuit parameter mismatches, noise, and deviations in various applied voltages.

SUMMARY OF THE INVENTION

The present invention provides a high speed and low power CMOS data transfer arrangement that includes two active pull up/pull down bus drivers, a differential bus that precharges to a specific voltage level and a latched differential sense amplifier that serves as a bus receiver.

In accordance with one embodiment of the present invention, a data transfer arrangement includes two bus drivers, a voltage precharge source, a differential bus coupled to the bus drivers and to the voltage precharge source, and a latching sense amplifier coupled to the differential bus.

In accordance with another embodiment of the present invention, the latching sense amplifier is arranged as a cross coupled latched amplifier.

In accordance with a further embodiment of the present invention, the two bus drivers consist of active pull up/pull down bus drivers.

Thus, the present invention provides a data transfer arrangement that operates at a high speed and uses low power. The data transfer arrangement is faster because the bus voltage swing passes directly to high gain nodes of the cross-coupled latched amplifier. Additionally, the data transfer arrangement uses a lower number of stacked transistors coupled between the Supply voltage and the high gain nodes when compared to the prior art. Additionally, the arrangement according to the present invention is less sensitive to deviations in voltage sources and the deviation of threshold voltage concerns of the input transistors. Additionally, the arrangement is less sensitive to circuit parameter mismatches, data bus common mode noise and power bus noises.

Other features and advantages of the present invention will be understood upon reading and understanding the detailed description of the preferred embodiments below, in conjunction with reference to the drawings, in which like numerals represent like elements.

DETAILED DESCRIPTION OF THE PREFERRED EXEMPLARY EMBODIMENTS

Figure 1:
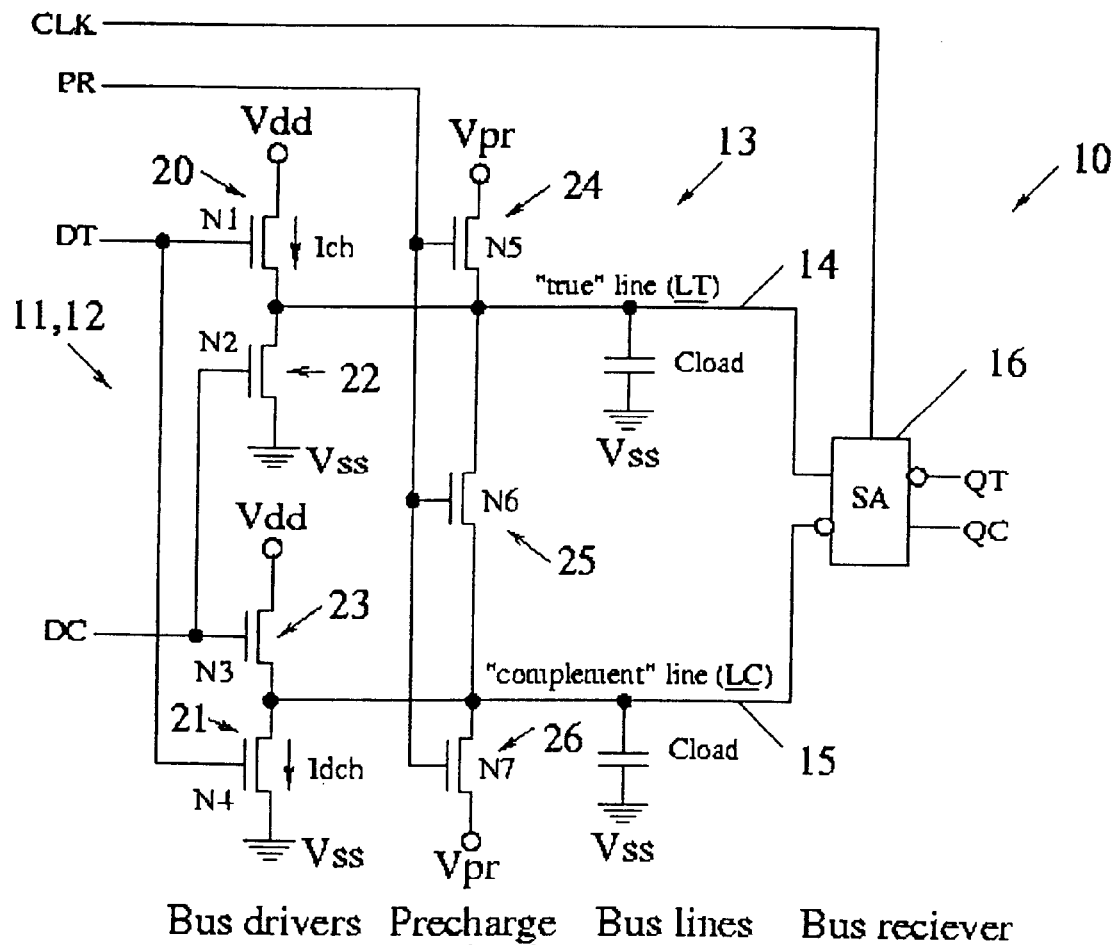
FIG. 1 is a schematic of a differential data transfer arrangement in accordance with the present invention.

FIG. 1 illustrates a data transfer arrangement circuit 10 that includes two bus drivers 11, 12, a precharge circuit 13, and two complementary bus lines 14, 15. The bus lines are inputs to a bus receiver 16 that is arranged as a latching sense amplifier.

The two bus drivers are complementary and consist, preferably, of two active pull up/active pull down bus drivers.

Operation of the data transfer arrangement consists of two phases: A bus precharge phase and a data transfer phase.

During the bus precharge phase, the control input PR (control signal for bus precharge circuit 13) is high and signal inputs DT (true phase of dual-rail data function) and DC (complement phase of dual-rail data function) are low. The true phase driver on transistors 20 and 21 and the complement phase driver on transistors 22 and 23 are in high impedance state and both bus lines are equalized and precharged to a potential $V_{pr}$ (buses precharging voltage level) through the turned on transistors 24, 25 and 26.

During the data transfer phase, the control input PR is low. The signal inputs become differential: DT is high and DC is low, and vise versa. One of the drivers is pulled up and charges the appropriate bus line from the precharged level $V_{pr}$ toward a more positive $V_{dd}-V_t$ (where $V_t$ is the threshold voltage of the pull up NMOS transistor of the driver). At the same time, the other driver is pulled down and discharges the opposite bus line from the precharged level $V_{pr}$ towards a more negative level $V_{ss}$ (ground). This provides a differential voltage: +dV and –dV from the precharging level $V_{pr}$ between true and complement bus lines. To provide proper operation of the bus receiver (the sensing amplifier), the minimum voltage difference 2* $dV_{min}$ (swing) between the lines may be about 0.05–0.20V. This low voltage swing is a basis to obtain high frequency of data transfer through the bus.

Figure 2:
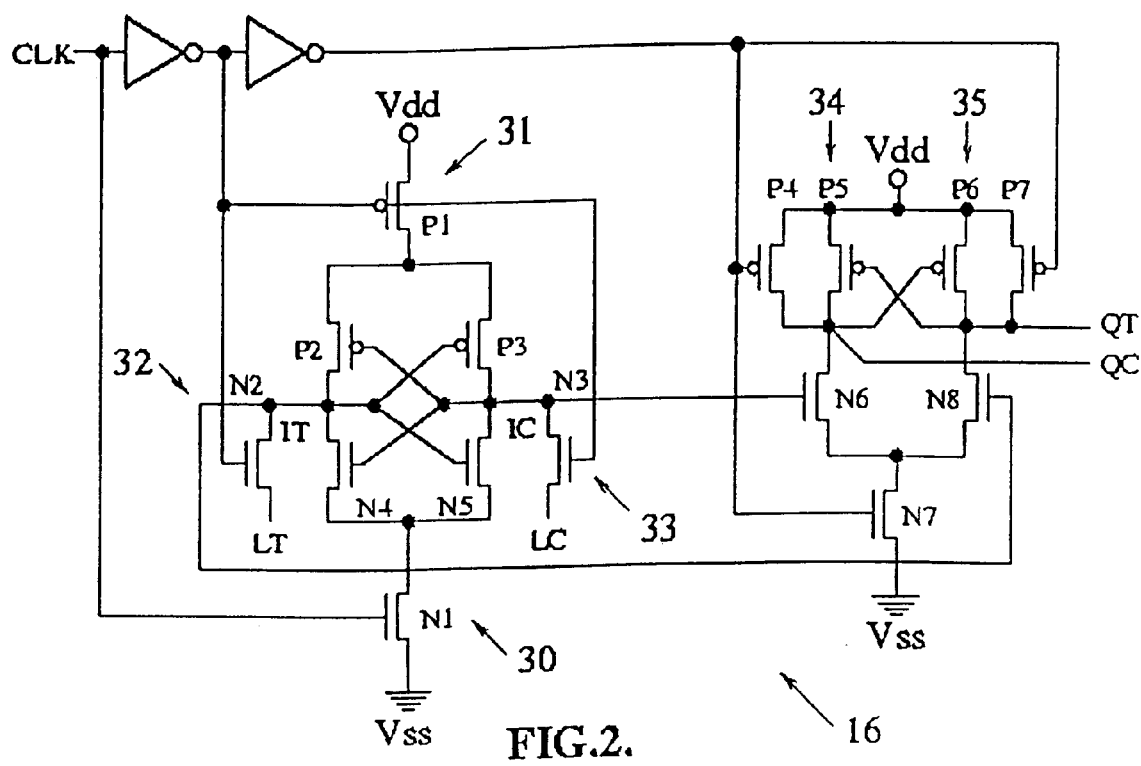
FIG. 2 is a schematic of a circuit for a sense amplifying latch for use in the data transfer arrangement illustrated in FIG. 1.

FIG. 2 illustrates sensing amplifier 16. Preferably, the sensing amplifier is a cross-coupled latched amplifier.

The sense amplifier operates in two phases, a precharge phase and a data transfer phase. However, the sensing amplifier operates opposite to analogous phases of the bus driver.

When the control input CLK is low and the bus driver is in the data transfer mode, the sensing amplifier is in the precharge mode. The cross-coupled latched amplifier is isolated from the power buses (transistors 30 and 31 arc turned off).

Transistors 32 and 33 are turned on and thus, the bus voltage swing passes to the internal nodes IT (positive binary single-rail internal point of the sensing amplifier) and IC (negative binary single-rail data input phase internal point of the sensing amplifier) of the latched amplifier. The output nodes of both dynamic gates are precharged to $V_{dd}$ and the complementary outputs QT (true phase of dual-rail data output signal) and QC (complement phase of dual-rail output data signal) of the sensing amplifier become high.

When the control input CLK is high and the bus driver is in the precharge mode, the sensing amplifier is in the data transfer mode. Transistors 32 and 33 are turned of and isolate the internal nodes IT and IC of the latched amplifier from the bus lines. The cross-coupled latched amplifier is connected to power buses (transistors 30 and 31 are turned on) and it begins to amplify the low voltage swings of the internal nodes IT and IC to full logic levels. The output node of one of the dynamic gates is discharged to ground and the appropriate output QT or QC of the sensing amplifier becomes low.

The use of domino output stages in accordance with the present invention instead of static inverters is necessary to avoid leakage currents and output glitches, which may appear because potentials of nodes IT and IC are approximately equal to $V_{pr}$ during the operating cycle of the bus driver. Weak PMOS transistors 34 and 35 are preferably included in the sensing amplifier to help prevent output glitches.

The data transfer arrangement in accordance with the present invention provides an increase in speed due to the differential low voltage swing bus driver in combination with the use of the latched differential sense amplifier as the bus receiver.

A further increase in speed is attained with the data transfer arrangement due to the pull up/pull down bus drivers, which provide equal low differential voltage swings +dV/ −dV in both bus lines. This allows both bus lines to be active during the data transfer phase, eliminates the necessity to use special circuits for holding the precharged level and leads to a reduction in the capacitance load of the driver.

The buses precharging to the specific level between ground and $V_d$ ($V_{pr}=K*V_{dd}$, where K=⅓ for the ideal MOS model) also provides: equal charge and discharge driver currents $I_{ch}=Id_{ch}$, provided by the NMOS pull up follower and the NMOS pull down switch, respectively, and therefore, equal differential voltage swings dV in both charged and discharged bus during the data transfer phase Pdtf:+dV=$I_{ch}*D_{dft}/C_{LOAD}$; and −dV=$I_{dch}*T_{dtf}/C_{LOAD}$. $I_{ch}$ represents the driver pull up output current (which provides the $C_{LOAD}$ charging from $V_{pr}$ up to $V_{dd}$); $I_{dch}$ represents the driver pull down output current (providing the $C_{LOAD}$ discharging from $V_{pr}$ up to $V_{ss}$); $C_{LOAD}$ represents the bus lines' compacitances; +dV represents the bus voltage change up from $V_{pr}$ during data transfer phase; −dV represents the bus voltage change down from $V_{pr}$ during data transfer phase; and $T_{dtf}$ represents the data transfer phase duration. The buses precharging to the specific level between ground and $V_{dd}$ also provides high noise immunity due to active mode for both buses that equal low output resistances of the drivers in pull up and pull down mode and; low total power consumed by drivers during the cycle of operation (transfer plus precharge).

The latched sense amplifier is faster due to the bus voltage swing passing directly to the high-gain nodes IT and IC of the cross- coupled latched amplifier, the lower number of stacked transistors that are connected between the supply voltage $V_{dd}$ (or $V_{cc}$) and nodes IT and IC, the fact that during latching of the IT and IC nodes, the nodes are charged by $K*V_{dd}$ and $(1-K)*V_{dd}$ instead of simply $V_{dd}$. Additionally, the speed of the latched sensing amplifier is effected little by the deviation of voltage $V_{pr}$ and the deviation of the threshold voltage of the input transistors.

In addition to the higher speed and low power consumption of the data transfer arrangement in accordance with the present invention, the arrangement is also less sensitive to circuit parameters mismatching, data bus common mode noise and power buses' noises since both drivers are active during data transfer phase. During the appropriate bus precharge phase, the bus receiver is isolated from the bus lines.

Although the invention has been described with reference to specific exemplary embodiments, it will be appreciated that it is intended to cover all modifications and equivalents within the scope of the appended claims.

What is claimed is:

1. A data transfer arrangement comprising:
   two bus drivers;
   a voltage precharge source;
   a differential bus coupled to the bus drivers and to the voltage precharge source; aid
   a latching sense amplifier coupled to the differential bus;
   wherein the latching sense amplifier comprises:
   a first stage including a cross-coupled latch coupled to a differential data bus; and
   an output stage coupled to an output of said first stage; wherein the output of the first stage is coupled to an input of the output stage;
   wherein the differential bus and the differential data bus are precharge to a voltage Vpr between Vdd and ground, where Vpr=K*Vdd, and K is a precharging voltage factor.

2. The data transfer arrangement in accordance with claim 1 wherein the bus drivers comprise active pull-up and active pull-down bus drivers.

3. The data transfer arrangement in accordance with claim 1, wherein the first stage of the latching sense amplifier comprises:
   a plurality of input pass transistors each having a gate, a source terminal, and a drain; and
   a plurality of NMOS and PMOS transistors each having a gate, a source terminal, and a drain;
   wherein the drains of the input pass transistors are coupled to the drains of the cross-coupled latch amplifier NMOS and PMOS transistors, each source terminal of the input pass transistors is coupled to an input, the sources of the cross-coupled latch amplifier NMOS transistors are coupled to the drain of the NMOS transistor coupled to a clock signal input, and the sources of the PMOS transistors are coupled to the drain of the PMOS transistor having a gate coupled to an inverted clock signal input.

4. The data transfer arrangement in accordance with claim 1, wherein the output stage of the latching sense amplifier comprises:
   a plurality of input transistors each having a gate, a source terminal, and a drain; and
   a pair of cross-coupled PMOS transistors each having a gate, a source terminal, and a drain;
   a first PMOS transistor having a gate, a source terminal, and a drain, the gate being coupled to a clock signal input; the source being coupled to the source of the first of the cross-coupled PMOS transistors; and the drain being coupled to the drain of the first of the input transistors; and
   a second PMOS transistor having a gate, a source terminal, and a drain, the gate being coupled to a clock signal input; the source being coupled to the source of a second of the cross-coupled PMOS transistors; and the drain being coupled to the drain of the second of the input transistors;
   wherein the sources of the input transistors are coupled to a source of an NMOS transistor having a gate coupled to a clock signal input;
   wherein the sources of the cross-coupled PMOS transistors are coupled to a voltage supply, the drains of the cross-coupled PMOS transistors are coupled to the drains of the input transistors; and
   wherein the drains of the cross-coupled transistors provide a true and a complement phase of a data output signal.

5. The data transfer arrangement in accordance with claim 1, wherein the voltage precharge source is configured to precharge the differential bus to a predetermined voltage that is less than a logic high voltage and greater than a logic low voltage.

6. The data transfer arrangement in accordance with claim 1 further comprising a precharge circuit coupled between the precharge source and the differential bus.

7. The data transfer arrangement in accordance with claim 2 wherein the active pull up and pull down bus drivers are NMOS transistors.

8. A method of operation of a data transfer arrangement comprising:

two bus drivers;

a voltage precharge source;

a differential bus coupled to the bus drivers and to the voltage precharge source; and a latching sense amplifier coupled to the differential bus;

wherein the latching sense amplifier comprises:
 a first stage including a cross-coupled latch coupled to a differential data bus; and
 an output stage coupled to an output of said first stage; wherein the output of the first stage is coupled to an input, and wherein the sense amplifier operates in two phases:

a precharge phase and a data transfer phase;

wherein the precharge phase operates when a control input clock signal is low, said phase comprising the steps of:

isolating the cross-coupled latch amplifier from a plurality of power buses by turning off an NMOS transistor coupled to the clock signal input and a PMOS transistor coupled to the inverted clock signal input;

passing a bus voltage swing to a plurality of internal nodes IT and IC of the latched amplifier;

precharging both dynamic gates to Vdd; and providing a high true phase and a high complement phase of a data output signal; and wherein the data transfer phase operates when a control input clock signal is high, said phase comprising the steps of:

isolating the internal nodes of the latched amplifier from the bus lines by turning off the pass input transistors;

connecting the cross-coupled latched amplifier to power buses by turning on an NMOS transistor coupled to the clock signal input and a PMOS transistor coupled to an inverted clock signal input;

amplifying each low voltage swing of the internal nodes to full logic levels;

discharging an output node of one of the dynamic gates to ground; and providing a low true phase and a low complement phase of the data output signal.

* * * * *

US006366130C1

(12) INTER PARTES REEXAMINATION CERTIFICATE (924th)

United States Patent
Podlesny et al.

(10) Number: US 6,366,130 C1
(45) Certificate Issued: Aug. 4, 2014

(54) HIGH SPEED LOW POWER DATA TRANSFER SCHEME

(75) Inventors: Andrew V. Podlesny, Moscow (RU); Alexander V. Malshin, Moscow (RU); Alexander Y. Solomatnikov, Moscow (RU)

(73) Assignee: Elbrus International Limited, George Town Grand Cayman (KY)

Reexamination Request:
No. 95/000,657, Jan. 19, 2012

Reexamination Certificate for:
Patent No.: 6,366,130
Issued: Apr. 2, 2002
Appl. No.: 09/505,656
Filed: Feb. 17, 2000

Related U.S. Application Data

(60) Provisional application No. 60/120,531, filed on Feb. 17, 1999.

(51) Int. Cl.
*G11C 7/06* (2006.01)
*G11C 7/10* (2006.01)

(52) U.S. Cl.
USPC ............... 326/95; 326/86; 326/87; 326/90; 327/52; 327/55; 327/57

(58) Field of Classification Search
None
See application file for complete search history.

(56) References Cited

To view the complete listing of prior art documents cited during the proceeding for Reexamination Control Number 95/000,657, please refer to the USPTO's public Patent Application Information Retrieval (PAIR) system under the Display References tab.

*Primary Examiner* — Deandra Hughes

(57) ABSTRACT

A data transfer arrangement. The data transfer arrangement includes two active pull up/active pull down bus drivers and a voltage precharge source. A differential bus is coupled to the bus drivers and to the voltage precharge source. A latching sense amplifier is coupled to the differential bus and serves as the bus receiver. The bus drivers operate in a precharge phase and a data transfer phase. The bus receiver operates in an analogous but opposite manner, i.e., when the bus drivers are in the precharge phase, the bus receiver is in the data transfer phase and when the bus drivers are in the data transfer phase, the bus receiver is in a precharge phase.

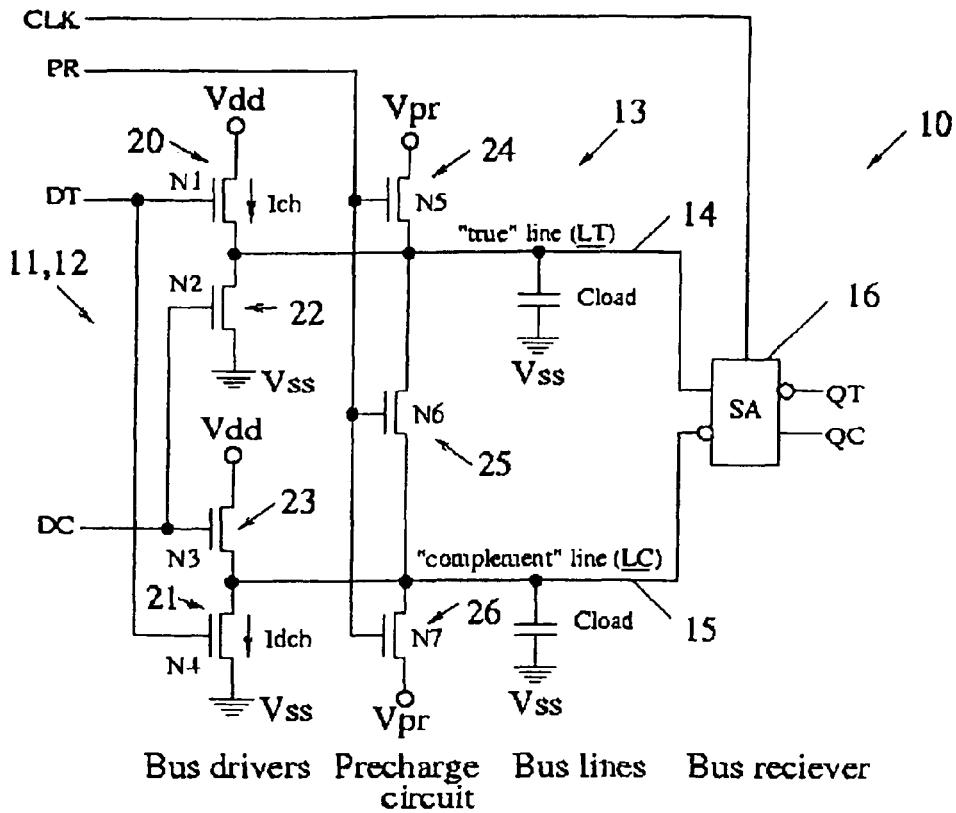

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-2 and 5-7 is confirmed.

New claim 9 is added and determined to be patentable.

Claims 3-4 and 8 were not reexamined.

*9. The data transfer arrangement of claim 1 wherein the output stage includes cross-coupled feedback.*

\* \* \* \* \*